(12) United States Patent
Briant et al.

(10) Patent No.: US 9,935,403 B1
(45) Date of Patent: Apr. 3, 2018

(54) PLUGGABLE MODULE HAVING COOLING CHANNEL

(71) Applicant: TE CONNECTIVITY CORPORATION, Berwyn, PA (US)

(72) Inventors: Eric David Briant, Dillsburg, PA (US); Nikhil Shankar, Harrisburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/430,679

(22) Filed: Feb. 13, 2017

(51) Int. Cl.
*H01R 13/648* (2006.01)
*H01R 13/659* (2011.01)
*H01R 13/518* (2006.01)
*H05K 7/20* (2006.01)
*H01R 13/66* (2006.01)

(52) U.S. Cl.
CPC ......... *H01R 13/659* (2013.01); *H01R 13/518* (2013.01); *H01R 13/665* (2013.01); *H05K 7/20127* (2013.01); *H05K 7/20409* (2013.01)

(58) Field of Classification Search
CPC .................. G01B 6/24; H01R 13/6594; H05K 2201/10121
USPC .................................. 439/485, 607.2, 607.21
See application file for complete search history.

(56) References Cited

U.S. PATENT DOCUMENTS

| | | | |
|---|---|---|---|
| 6,816,376 B2 | 11/2004 | Bright et al. | |
| 7,625,223 B1 | 12/2009 | Fogg | |
| 8,226,304 B2 * | 7/2012 | Yoshikawa | G02B 6/4246 385/88 |
| 8,292,669 B2 * | 10/2012 | Wang | H01R 12/721 439/607.2 |
| 8,535,096 B1 * | 9/2013 | Shirk | H01R 13/648 439/374 |
| 8,747,159 B2 * | 6/2014 | Liu | G02B 6/428 439/607.2 |
| 8,890,004 B2 * | 11/2014 | Wickes | H01R 13/6583 174/354 |
| 9,509,102 B2 | 11/2016 | Sharf et al. | |

\* cited by examiner

*Primary Examiner* — Phuong Dinh

(57) ABSTRACT

A pluggable module includes a pluggable body having a top and channel walls extending above the top defining a cooling channel along the top. The cooling channel allows airflow between a front end and a mating end of the pluggable body. The pluggable module includes a communication circuit board held in the pluggable body. The pluggable module includes an EMI shield coupled to the pluggable body above the top. The EMI shield has a shield plate spanning the cooling channel. The shield plate is metal and provides electrical shielding across the cooling channel. The shield plate has openings allowing airflow therethrough to flow through the cooling channel.

20 Claims, 3 Drawing Sheets

PLUGGABLE MODULE HAVING COOLING CHANNEL

BACKGROUND OF THE INVENTION

The subject matter herein relates generally to pluggable modules having cooling channels.

At least some known communication systems include receptacle assemblies, such as input/output (I/O) connector assemblies, that are configured to receive a pluggable module and establish a communicative connection between the pluggable module and an electrical communication connector of the receptacle assembly. As one example, a known receptacle assembly includes a cage member that is mounted to a circuit board and configured to receive a small form-factor pluggable (SFP) transceiver in an elongated cavity of the cage member. The pluggable module and the electrical connector have respective electrical contacts that engage one another to establish a communicative connection.

Electrical shielding of the components of the communication system is typically achieved using a receptacle housing or cage that provides shielding around the module cavity that receives the pluggable module. Gaskets are provided in the opening to interface with the pluggable module. However, as data speeds through the communication system increase, heat generated by the components is likewise increased. Heat dissipation from the components is problematic. Some known communication systems provide airflow channels along the pluggable module to provide cooling for the pluggable module, the communication connector or other components of the system. However, the airflow channels define large openings, which is problematic for EMI containment.

Accordingly, there is a need for a communication system having receptacle assemblies and pluggable modules having sufficient EMI containment while providing cooling channels for cooling airflow.

BRIEF DESCRIPTION OF THE INVENTION

In one embodiment, a pluggable module is provided having a pluggable body extending between a front end and a mating end. The mating end is receivable in a module cavity of the receptacle assembly to mate with the communication connector. The pluggable body has a top and channel walls extending above the top defining a cooling channel along the top. The cooling channel allows airflow between the front end and the mating end. The pluggable module includes a communication circuit board held in the pluggable body. The pluggable body is configured to be plugged into the receptacle assembly such that the communication circuit board is communicatively coupled to the communication connector of the receptacle assembly. The pluggable module includes an EMI shield coupled to the pluggable body above the top. The EMI shield has a shield plate spanning the cooling channel. The shield plate is metal and provides electrical shielding across the cooling channel. The shield plate has openings allowing airflow therethrough to flow through the cooling channel.

In another embodiment, a pluggable module is provided including a pluggable body extending between a front end and a mating end. The mating end is receivable in a module cavity of the receptacle assembly to mate with the communication connector. The pluggable body has a top and channel walls extending above the top defining a cooling channel along the top. The cooling channel allows airflow between the front end and the mating end. The pluggable module includes a communication circuit board held in the pluggable body. The pluggable body is configured to be plugged into the receptacle assembly such that the communication circuit board is communicatively coupled to the communication connector of the receptacle assembly. The pluggable module includes an EMI shield coupled to the pluggable body above the top. The EMI shield has a mounting plate spanning the channel walls and a shield plate extending from the mounting plate into the cooling channel. The shield plate spans the cooling channel. The shield plate has openings allowing airflow therethrough to flow through the cooling channel. The EMI shield is metal and provides electrical shielding across the cooling channel. The mounting plate has a gasket interface configured to be electrically connected to an EMI gasket of the receptacle assembly.

In a further embodiment, a communication system is provided including a cage member having a plurality of walls defining a module cavity extending between a front end and a back end. The cage member surrounds a communication connector at the back end. At least one of the panels defines a top of the cage member. The cage member is configured to be mounted to a circuit board at a bottom of the cage member. The panels are conductive to provide EMI shielding for the module cavity. The communication system includes a pluggable module received in the module cavity and coupled to the communication connector. The pluggable module includes a pluggable body extending between a front end and a mating end. The mating end is receivable in a module cavity of the receptacle assembly to mate with the communication connector. The pluggable body has a top and channel walls extending above the top defining a cooling channel along the top. The cooling channel allows airflow between the front end and the mating end. The pluggable module includes a communication circuit board held in the pluggable body. The pluggable body is configured to be plugged into the receptacle assembly such that the communication circuit board is communicatively coupled to the communication connector of the receptacle assembly. The pluggable module includes an EMI shield coupled to the pluggable body above the top. The EMI shield has a shield plate spanning the cooling channel. The shield plate is metal and provides electrical shielding across the cooling channel. The shield plate has openings allowing airflow therethrough to flow through the cooling channel.

DETAILED DESCRIPTION OF THE INVENTION

Figure 1:
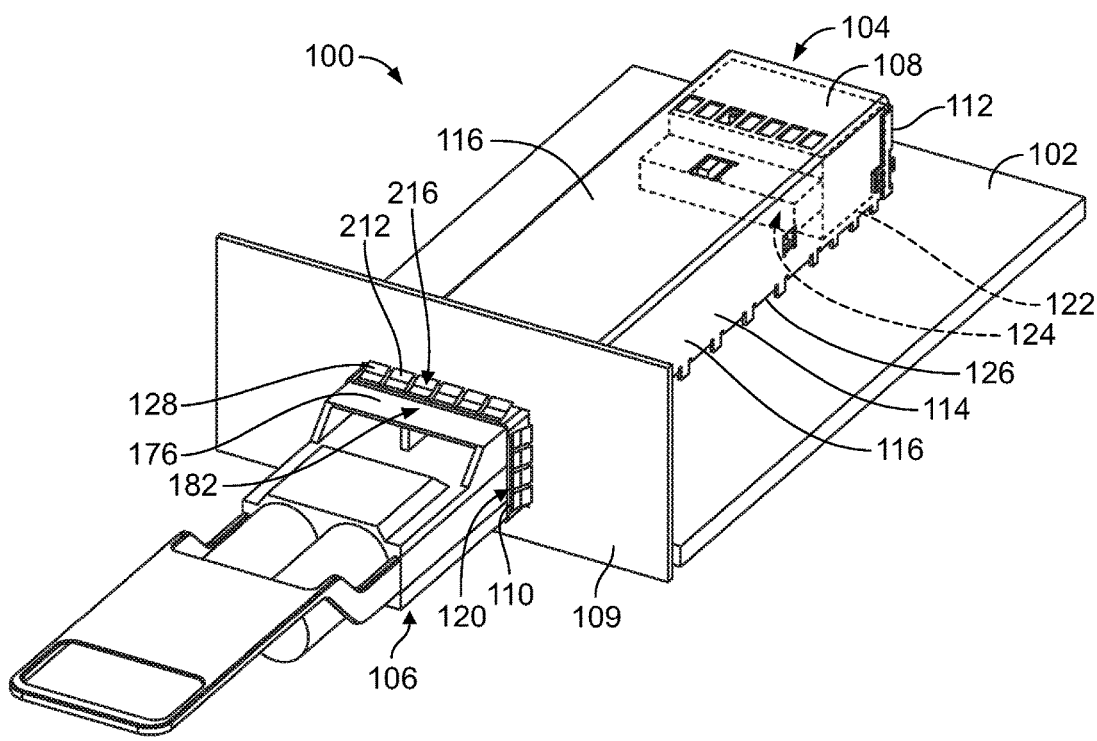
FIG. 1 is a front perspective view of a communication system including a pluggable module in accordance with an embodiment.

FIG. 1 is a front perspective view of a communication system 100 in accordance with an embodiment. The communication system 100 includes a circuit board 102, a receptacle assembly 104 mounted to the circuit board 102, and a pluggable module 106 that is configured to be received in the receptacle assembly 104. The circuit board 102 may be a daughter card or a mother board and include conductive traces (not shown) extending therethrough. Optionally, the pluggable module 106 may be communicatively coupled to the receptacle assembly 104, such as to a communication connector, to send and/or receive data signals with components of the communication system 100.

The communication system 100 may be part of or used with telecommunication systems or devices. For example, the communication system 100 may be part of or include a switch, router, server, hub, network interface card, or storage system. In the illustrated embodiment, the pluggable module 106 is configured to transmit data signals in the form of electrical signals. In other embodiments, the pluggable module 106 may be configured to transmit data signals in the form of optical signals. The circuit board 102 may be a daughter card or a mother board and include conductive traces (not shown) extending therethrough.

In the illustrated embodiment, the receptacle assembly 104 is illustrated as a single port receptacle assembly configured to receive a single pluggable module 106; however, the receptacle assembly 104 may be a multi-port receptacle assembly in other embodiments configured to receive pluggable modules 106 in multiple ports. For example, the multiple ports of the receptacle assembly 104 may be ganged side-by-side and/or stacked in addition to, or alternative to, ganged ports.

The pluggable module 106 is an input/output (I/O) module configured to be inserted into and removed from the receptacle assembly 104. For example, the pluggable module 106 may be a small form-factor pluggable (SFP) transceiver or quad small form-factor pluggable (QSFP) transceiver, such as those satisfying certain technical specifications for SFP or QSFP transceivers, such as Small-Form Factor (SFF)-8431. By way of example, the pluggable module 106 may be used in place of transceivers which are part of the SFP+ product family available from TE Connectivity.

The receptacle assembly 104 includes a cage member 108 that is mounted to the circuit board 102. The cage member 108 may be arranged at a bezel or panel 109 of a chassis of the system or device, such as through an opening in the panel 109. As such, the cage member 108 is interior of the device and corresponding panel 109 and the pluggable module(s) 106 is loaded into the cage member 108 from outside or exterior of the device and corresponding panel 109. Optionally, the panel 109 may include a plurality of openings each configured to receive a corresponding pluggable module 106. In other various embodiments, the opening in the panel 109 may be sized to receive multiple pluggable modules 106, such as when a multi-port receptacle assembly 104 is used.

The cage member 108 includes a front end 110 and an opposite rear end 112. The front end 110 may be provided at, and extend through an opening in, the panel 109. Relative or spatial terms such as "front," "back," "top," or "bottom" are only used to distinguish the referenced elements and do not necessarily require particular positions or orientations in the communication system 100 or in the surrounding environment of the communication system 100. For example, the front end 110 may be located in or facing a back portion of a larger telecommunication system. In many applications, the front end 110 is viewable to a user when the user is inserting the pluggable module 106 into the receptacle assembly 104. The pluggable module 106 is accessible to the user and viewable to the user when the pluggable module 106 is inserted into the receptacle assembly 104. As such, the pluggable module 106 may be used for testing the communication system 100. For example, the pluggable module may be interacted with and/or viewable during testing, as described in further detail below.

The cage member 108 is configured to contain or block electromagnetic interference (EMI) and guide the pluggable module(s) 106 during a mating operation. To this end, the cage member 108 includes multiple pieces assembled together to enclose the pluggable module 106. For example, the pieces may be snap-fit together and/or welded together. When the cage member 108 is mounted to the circuit board 102, the cage member 108 is electrically coupled to the circuit board 102 and, in particular, to ground planes (not shown) within the circuit board 102 to electrically ground the cage member 108. As such, the receptacle assembly 104 may reduce EMI that may negatively affect electrical performance of the communication system 100. The pluggable module 106 may be used to block or plug the cavity in the receptacle assembly 104, such as for EMI containment and/or shielding.

In an exemplary embodiment, the cage member 108 includes a receptacle housing 114 defined by a plurality of housing panels or walls 116, which may be formed from one or more pieces. The various walls 116 provide shielding for vulnerable areas of other components, such as by covering or shielding openings in walls of the other components. The receptacle housing 114 extends between the front end 110 and the rear end 112. The walls 116 are formed from conductive material, such as sheet metal and/or a polymer having conductive particles. In the illustrated embodiment, the pieces are stamped and formed from sheet metal. In some embodiments, the cage member 108 is configured to facilitate airflow through the cage member 108 to transfer heat (or thermal energy) away from the receptacle assembly 104 and the pluggable module(s) 106. The air may flow from inside the cage member 108 (for example, behind the panel 109) to the external environment (for example, forward of the panel 109) or from outside the cage member 108 into the interior of the cage member 108. Fans or other air moving devices may be used to increase airflow through the cage member 108 and over the pluggable module(s) 106.

The receptacle housing 114 defines a module cavity 120 extending between the front and rear ends 110, 112. The module cavity 120 receives the pluggable module 106. The module cavity 120 extends lengthwise in a direction that is parallel to the plugging axis of the pluggable module 106. For a multi-port receptacle assembly 104, multiple module cavities 120 or ports are defined for receiving multiple pluggable modules 106. In such embodiments, the module cavities 120 may be stacked vertically and/or ganged horizontally. Separator panels may be provided between the module cavities 120 to provide shielding between the module cavities 120.

The receptacle assembly 104 includes a communication connector 122 (shown in phantom in FIG. 1) having a mating interface 124 for mating with the pluggable module 106. The communication connector 122 may have multiple mating interfaces when configured to mate with multiple pluggable modules 106, such as when used in a stacked cage member. The communication connector 122 is disposed at the rear end of the module cavity 120. In an exemplary embodiment, the communication connector 122 is provided at or near the rear end 112 of the cage member 108. The communication connector 122 includes electrical contacts (not shown) that are configured to be mated with the pluggable module 106. The communication connector 122 is configured to be mounted to the circuit board 102. The communication connector 122 is configured to be received in the cage member 108 through a bottom 126 of the cage member 108. For example, the cage member 108 is configured to be mounted to the circuit board 102 over the communication connector 122 such that the communication connector 122 passes through an opening in the bottom 126 as the cage member 108 is mounted to the circuit board 102.

In an exemplary embodiment, the receptacle assembly 104 includes an EMI gasket 128 at the front end 110 of the receptacle housing 114. The EMI gasket 128 interfaces with the panel 109, such as within the opening in the panel 109 that receives the receptacle assembly 104. The EMI gasket 128 may be one or more separate pieces, which may be attached to the receptacle housing 114, such as by clipping onto the receptacle housing 114, welding to the receptacle housing 114 or otherwise being secured to the receptacle housing 114. In other various embodiments, the EMI gasket 128 may be integral with the receptacle housing 114, such as being stamped and formed out of or extending from the walls 116 of the receptacle housing 114. The EMI gasket 128 may extend into the module cavity 120 to engage the pluggable module 106.

Figure 2:
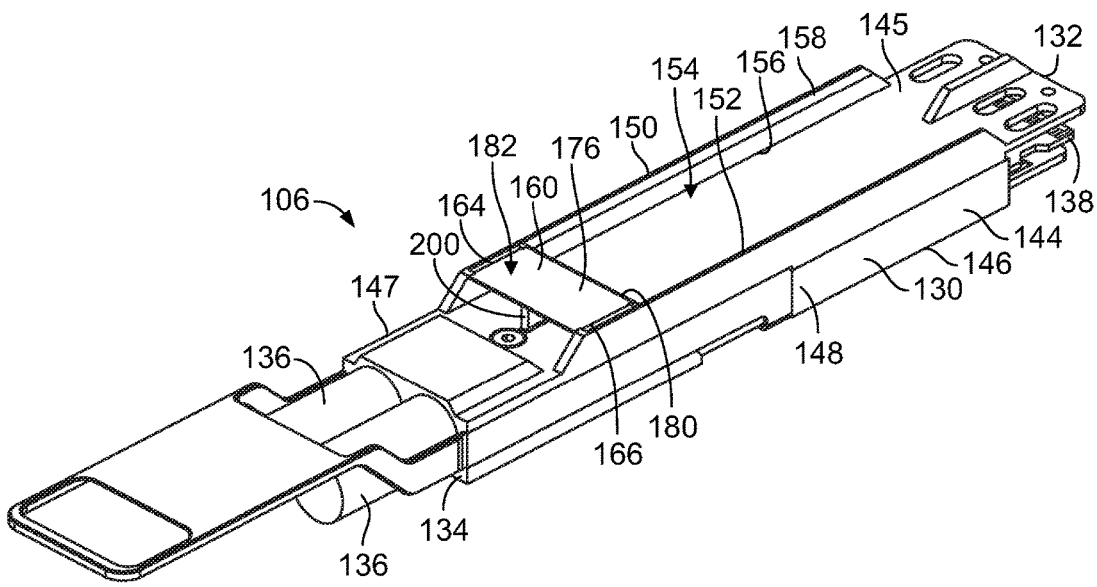
FIG. 2 is a front perspective view of the pluggable module in accordance with an exemplary embodiment.
Figure 3:
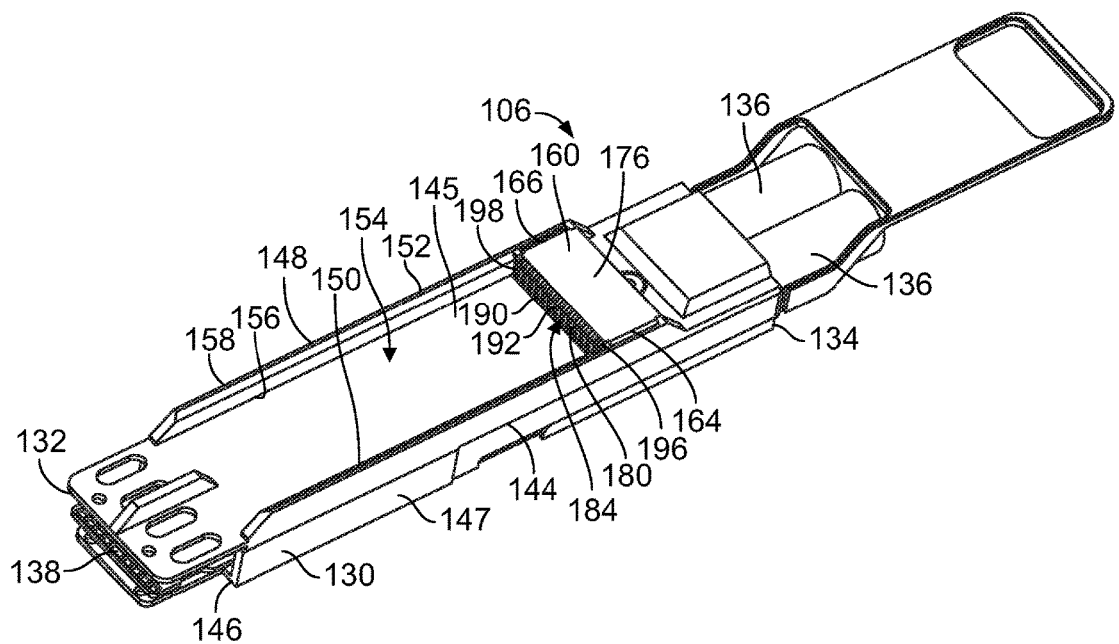
FIG. 3 is a rear perspective view of the pluggable module in accordance with an exemplary embodiment.

FIG. 2 is a front perspective view of the pluggable module 106 in accordance with an exemplary embodiment. FIG. 3 is a rear perspective view of the pluggable module 106 in accordance with an exemplary embodiment. The pluggable module 106 has a pluggable body 130, which may be defined by one or more shells. The pluggable body may be thermally conductive and/or may be electrically conductive, such as to provide EMI shielding for the pluggable module 106. The pluggable body 130 includes a mating end 132 and an opposite front end 134. The mating end 132 is configured to be inserted into the module cavity 120 (shown in FIG. 1) for mating with the communication connector 122 (shown in FIG. 1). The front end 134 is typically a cable end having one or more cables 136 extending to another component within the system. The front end 134 is exposed forward of the panel 109 from the exterior of the receptacle assembly 104.

The pluggable body 130 includes a communication circuit board 138 held within the pluggable body 130. The communication circuit board 138 is configured to be communicatively coupled to the communication connector 122 (shown in FIG. 1). The communication circuit board 138 may be accessible or exposed at the mating end 132. The cables 136 are terminated to the communication circuit board 138, such as directly or through a connector on the communication circuit board 138. The cables 136 may be copper wires transmitting electrical signals or may be fiber optic cables transmitting optical signals. The communication circuit board 138 has components connected thereto for transmitting the signals between the cables 136 and the mating end of the communication circuit board 138. For example, the communication circuit board 138 may have conductors, traces, pads, electronics, sensors, controllers, switches, inputs, outputs, and the like associated with the communication circuit board 138, which may be mounted to the communication circuit board 138, to form circuits and to control operation of the pluggable module 106.

The pluggable module 106 includes an outer perimeter defining an exterior 144 of the pluggable body 130. The exterior 144 extends between the mating end 132 and the front end 134 of the pluggable module 106. The exterior 144 is defined by one or more surfaces of the pluggable body 130. For example, the exterior 144 may be defined by a top 145, a bottom 146 and opposite first and second sides 147, 148 of the pluggable body 130.

In an exemplary embodiment, the pluggable body 130 provides heat transfer for the communication circuit board 138, such as for the electronic components on the communication circuit board 138. For example, the communication circuit board 138 is in thermal communication with the pluggable body 130 and the pluggable body 130 transfers heat from the communication circuit board 138.

The pluggable body 130 has channel walls 150, 152 extending above the top 145 that define a cooling channel 154 along the top 145 of the pluggable body 130. The cooling channel 154 allows airflow between the front end 134 and the mating end 132. The airflow may be used to cool the pluggable body 130, components held within the pluggable body 130, such as the components of the communication circuit board 138, and/or to cool other components, such as the communication connector 122 or other components within the system 100. The air may flow from front-to-back or from back-to-front within the cooling channel 154.

The channels walls 150, 152 have bases 156 at the top 145 and distal ends 158 opposite the bases 156. The top 145 is the main upper surface of the pluggable body 130 used to enclose the pluggable body and cover the communication circuit board 138. The distal ends 158 are elevated above the top 145. The channel walls 150, 152 may be planar and may be parallel to each other. The channel walls 150, 152 may extend any length between the front end 134 and the mating end 132, such as substantially the entire length, as in the illustrated embedment. The channel walls 150, 152 may have angled ends defining lead-in surfaces to guide loading of the pluggable module 106 into the module cavity 120.

In an exemplary embodiment, the channel walls 150, 152 are provided at the sides 147, 148, respectively, such that the cooling channel 154 spans the entire width of the pluggable body 130 between the channel walls 150, 152. The cooling channel 154 is open near the front end 134 (for example, between the channel walls 150, 152) and near the mating end 132 (for example, between the channel walls 150, 152) to allow airflow through the pluggable module 106. In other various embodiments, the channel walls 150, 152 may be at other locations. Optionally, more than two channel walls 150, 152 may be provided, such as one or more channel walls between the outer channel walls 150, 152, which may sub-divide the cooling channel 154 into cooling sub-channels.

The pluggable module 106 includes an EMI shield 160 to provide EMI shielding through the cooling channel 154. The EMI shield 160 is separate and discrete from the pluggable body 130 and as such may be manufactured by a different process. For example, the pluggable body 130 may be extruded while the EMI shield 160 may be stamped and formed. The EMI shield 160 provides features on the pluggable module 106 unable to be formed in a cost effective manner on an extruded part. In an exemplary embodiment, the EMI shield 160 is coupled to the pluggable body 130 above the top 145. For example, the EMI shield 160 spans across the cooling channel 154 between the channel walls 150, 152. The EMI shield 160 is electrically connected to the pluggable body 130 to provide electrical shielding.

Figure 4:
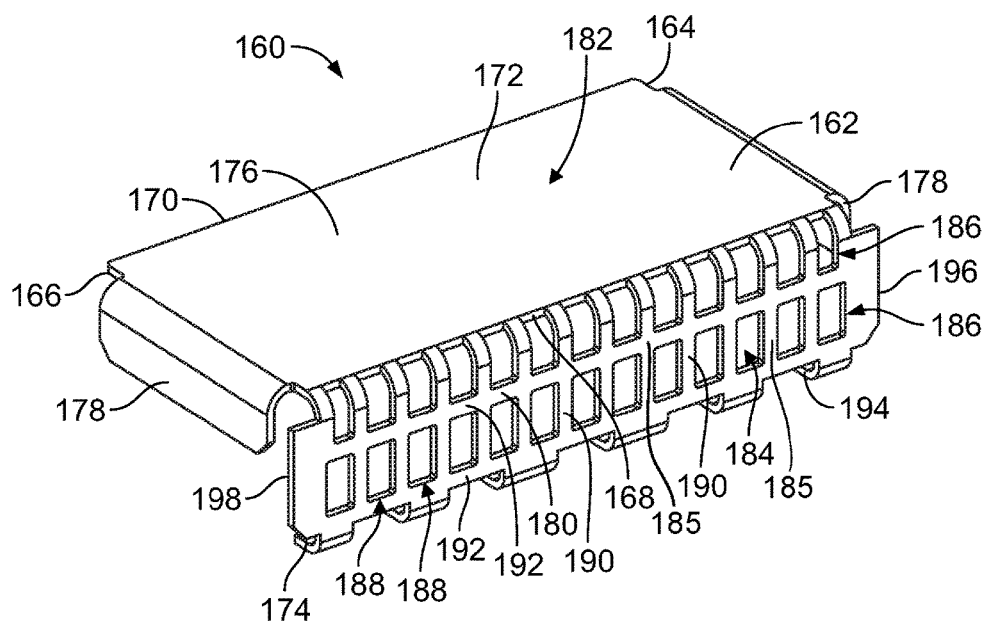
FIG. 4 is a perspective view of an EMI shield of the pluggable module formed in accordance with an exemplary embodiment.

FIG. 4 is a perspective view of the EMI shield 160 in accordance with an exemplary embodiment. The EMI shield 160 includes a metal body 162 having opposite sides 164, 166 and opposite ends 168, 170. The EMI shield 160 has a top 172 and a bottom 174. In an exemplary embodiment, the EMI shield 160 is a stamped and formed structure where the components thereof are stamped from a common sheet of metal and bent or folded into a desired shape. The EMI shield 160 includes a mounting plate 176 having mounting tabs 178 and a shield plate 180 extending from the mounting plate 176.

The mounting plate 176 is provided at the top 172. The mounting plate 176 may be generally planar and may extend between the sides 164, 166 and the ends 168, 170. The mounting tabs 178 extend downward from the mounting plate 176 at the sides 164, 166. The mounting tabs 178 are used to secure the EMI shield 160 to the pluggable body 130 (shown in FIG. 2). The mounting tabs 178 may have barbs or protrusions on the edges to engage the pluggable body 130 and secure the EMI shield 160 to the pluggable body 130. Other securing means may be provided in alternative embodiments, such as weld tabs, clips, or other securing means. In an exemplary embodiment, the mounting plate 176 includes a gasket interface 182 along the top 172 configured to interface with the EMI gasket 128 (shown in FIG. 1). Optionally, the mounting plate 176 may include bumps or protrusions at the gasket interface 182 for interfacing the with the EMI gasket 128. In other various embodiments, the mounting plate 176 may include spring beams stamped and formed therein for interfacing with the EMI gasket 128 and/or another component, such as the pluggable body 130 or the receptacle housing 114 (shown in FIG. 1).

The shield plate 180 extends downward from the mounting plate 176 at the end 168. The shield plate 180 is configured to span the cooling channel 154. The shield plate 180 is metal and provides electrical shielding across the cooling channel 154. The shield plate 180 has openings 184 therethrough for allowing airflow through the shield plate 180, and thus through the cooling channel 154. The openings 184 are defined between metal strips 185 of the shield plate 180. Any number of openings 184 may be provided. In the illustrated embodiment, the shield plate 180 includes the openings 184 in a plurality of rows 186 and a plurality of columns 188.

The shield plate 180 includes beams 190 between corresponding openings 184, such as between columns 188 of the openings 184. In various embodiments, the shield plate 180 includes cross beams 192 between corresponding openings 184, such as between rows 186 of the openings 184. For example, the cross beams 192 may span between the beams 190. The beams 190 and the cross beams 192 are formed from the metal strips 185 of the shield plate 180 and define a web of metal material between the openings 184 to provide EMI shielding. The spacing between the beams 190 and the spacing between the cross beams 192 define the sizes of the openings 184. The sizes of the openings 184 are selected to provide efficient EMI shielding. For example, the openings 184 are sufficiently small to prevent detrimental EMI shielding, such as to prevent EMI above a desired or target frequency. However, the openings 184 are large enough and/or frequent enough to allow significant airflow through the shield plate 180. In the illustrated embodiment, the openings 184 account for at least 50% of the surface area of the shield plate 180; however the openings 184 may account for more or less of the surface area of the shield plate 180 in alternative embodiments. In various embodiments, the openings 184 are wider than the beams 190 and/or taller than the cross beams 192.

The shield plate 180 includes mounting tabs 194 at the bottom 174. The mounting tabs 194 are configured to be mounted to the pluggable body 130. The mounting tabs 194 may be used to mechanically and/or electrically couple the shield plate 180 to the pluggable body 130. The shield plate 180 includes outer edges 196, 198 at the sides 164, 166, respectively. The outer edges 196, 198 may be used to mechanically and/or electrically couple the shield plate 180 to the pluggable body 130.

Returning to FIGS. 2 and 3, the EMI shield 160 is shown mounted to the pluggable body 130. In the illustrated embodiment, the mounting plate 176 and the shield plate 180 span between the channel walls 150, 152. For example, the mounting tabs 178 at the sides 164, 166 are mounted to the channel walls 150, 152. The outer edges 196, 198 at the sides 164, 166 may abut against the channel walls 150, 152, respectively. In other various embodiments, if the outer edges 196, 198 do not abut against the channel walls 150, 152, gaps therebetween may be sufficiently small to prevent EMI leakage therebetween.

The mounting plate 176 is mounted to the pluggable body 130 in a spaced apart position from the top 145 and parallel to the top 145. The shield plate 180 extends below the mounting plate 176 into the cooling channel 154. The bottom of the shield plate 180 may abut against the top 145 of the pluggable body 130. For example, the mounting tabs 194 may engage the top 145. The mounting tabs 194 may pass through the pluggable body 130, such as through openings, and then be folded over to secure the shield plate 180 to the pluggable body 130. The EMI shield 180 is electrically connected to the pluggable body 130.

In an exemplary embodiment, the shield plate 180 spans the entire cooling channel 154 between the channel walls 150, 152 to provide electrical shielding across the cooling channel 154. The openings 184 allow airflow through the shield plate 180, and thus through the cooling channel 154, while the beams 190 and the cross beams 192 block the EMI. The openings 184 have smaller cross-sections than the cooling channel 154 and the sum of the cross sections of the openings 184 have a smaller cross-sectional area than the cooling channel 154 because the beams 190 and cross beams 192 fill part of the cooling channel 154 to provide EMI shielding in the cooling channel 154. The openings 184 are sized such that the beams 190 and the cross beams 192 block EMI while allowing significant airflow through the shield plate 180.

The mounting plate 176 is oriented such that the gasket interface 182 is positioned to interface with the EMI gasket 128 (shown in FIG. 1 and FIG. 5) of the receptacle assembly. In the illustrated embodiment, the EMI shield 160 is oriented such that the shield plate 180 is at the rearward end of the EMI shield 160. However, in other various embodiments, the EMI shield 160 may be oriented with the shield plate 180 at the forward end of the EMI shield 160. In an exemplary embodiment, the pluggable body 130 includes a support wall 200 extending from the top 145, such as approximately centered between the channel walls 150, 152. The EMI shield 160 crosses over the support wall 200 and the support wall 200 supports the mounting plate 176 between the channel walls 150, 152. The support wall 200 divides a portion of the cooling channel 154 into sub-channels. Any number of support walls 200 may be provided.

Figure 5:
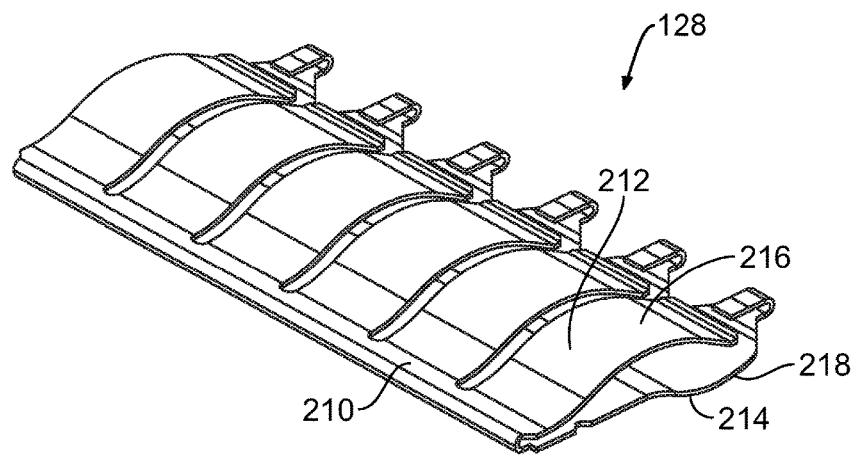
FIG. 5 is a perspective view of an EMI gasket of the communication system in accordance with an exemplary embodiment.

FIG. 5 is a perspective view of the EMI gasket 128 in accordance with an exemplary embodiment. The EMI gasket 128 includes a main body 210 at a front thereof. Upper spring beams 212 extend rearward from the main body 210 along the upper side and lower spring beams 214 extend rearward from the main body 210 along the lower side. The upper spring beams 212 have mating interfaces 216. The lower spring beams 214 have mating interfaces 218. The upper and lower spring beams 212, 214 may be curved to ensure that the spring beams 212, 214 interfere with corresponding components for electrical connection thereto.

Returning to FIG. 1, the EMI gasket 128 may be clipped to the receptacle housing 114, such as at the front end 110. However, the EMI gasket 128 may be otherwise secured to the receptacle housing 114, such as being welded to the receptacle housing 114. In other various embodiments, the EMI gasket 128 may be integral with the receptacle housing 114, such as being stamped and formed with the receptacle housing 114. The upper spring beams 212 extend along the exterior of the receptacle housing 114, while the lower spring beams 214 extend into the module cavity 120. The mating interfaces 216 of the upper spring beams 212 engage the panel 109. The mating interfaces 218 of the lower spring beams 214 (both shown in FIG. 5) are configured to engage the pluggable module 106 when loaded into the module cavity 120. For example, the mating interfaces 218 engage the gasket interface 182 of the mounting plate 176. The mounting plate 176 provides a flat surface for interfacing with the EMI gasket 128 to create an electrical connection between the pluggable module 106 and the receptacle housing 114.

Figure 6:
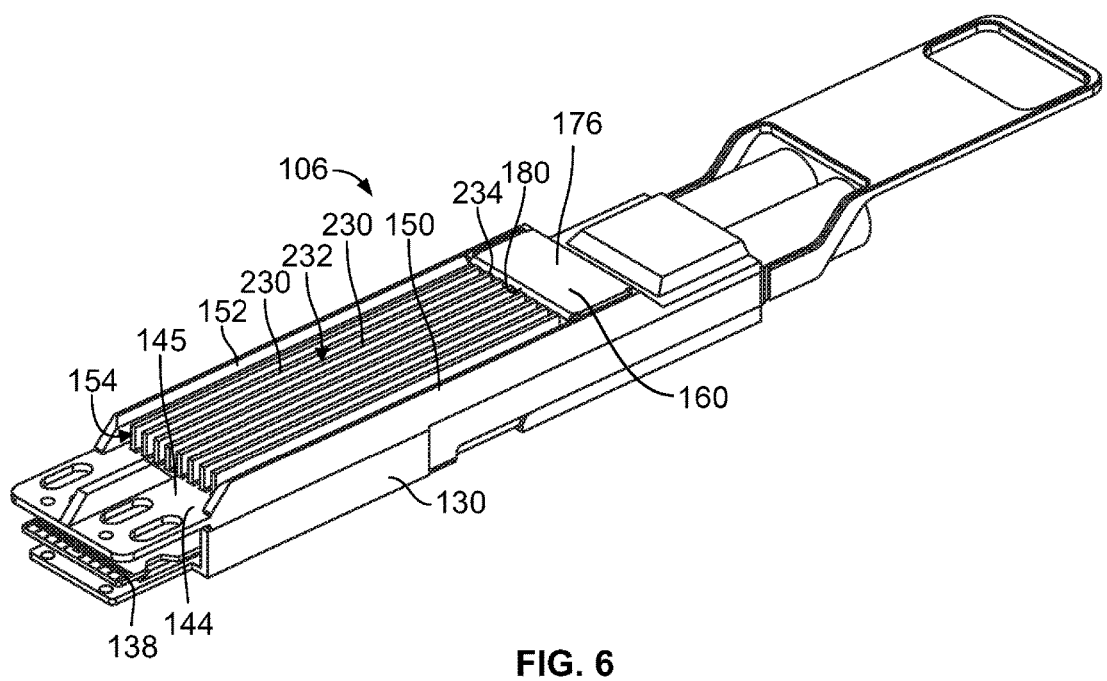
FIG. 6 is a rear perspective view of the pluggable module in accordance with an exemplary embodiment.

FIG. 6 is a rear perspective view of the pluggable module 106 in accordance with an exemplary embodiment. The pluggable body 130 includes a plurality of heat transfer fins 230 along at least a portion of the outer perimeter 144 of the pluggable module 106. For example, in the illustrated embodiment, the fins 230 are provided along the top 145 in the cooling channel 154. The fins 230 are positioned between the channel walls 150, 152. The fins 230 sub-divide the cooling channel 154 into sub-channels. The fins 230 transfer heat away from the main shell of the pluggable body 130, and thus from the communication circuit board 138 and associated components. The fins 230 are separated by gaps 232 that allow airflow or other cooling flow along the surfaces of the fins 230 to dissipate the heat therefrom. In the illustrated embodiment, the fins 230 are parallel plates that extend lengthwise; however the fins 230 may have other shapes in alternative embodiments, such as cylindrical or other shaped posts.

The EMI shield 160 is positioned adjacent the fins 230, such as at front ends 234 of the fins 230. The beams 190 and cross beams 192 (both shown in FIG. 4) may span across the gaps 232 to reduce the size of the gaps 232 and provide EMI shielding across the gaps 232. Optionally, the fins 230 may be located both in front of and behind the shield plate 180. For example, the mounting plate 176 may span across the tops of portions of the fins 230. Optionally, the mounting plate 176 may be as long as the fins 230 such that the mounting plate 176 completely covers the fins 230.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A pluggable module comprising:
a pluggable body extending between a front end and a mating end, the mating end being receivable in a module cavity of a receptacle assembly to mate with a communication connector, the pluggable body having a top and channel walls extending above the top defining a cooling channel along the top, the cooling channel allowing airflow between the front end and the mating end;
a communication circuit board held in the pluggable body and exposed at the mating end, wherein the pluggable body is configured to be plugged into the receptacle assembly such that the communication circuit board is communicatively coupled to the communication connector of the receptacle assembly; and
an EMI shield coupled to the pluggable body above the top, the EMI shield having a shield plate spanning the cooling channel, the shield plate being metal and providing electrical shielding across the cooling channel, the shield plate having openings allowing airflow therethrough to flow through the cooling channel.

2. The pluggable module of claim 1, wherein the pluggable body has a first side and a second side, the channel walls being provided at the first and second sides, the shield plate spanning between the channel walls.

3. The pluggable module of claim 1, wherein the cooling channel spans an entire width of the pluggable body between the channel walls, the shield plate spanning the width of the pluggable body.

4. The pluggable module of claim 1, wherein the openings of the shield plate are separated by metal strips defining beams.

5. The pluggable module of claim 4, wherein the openings are separated by metal strips defining cross beams extending between the beams.

6. The pluggable module of claim 1, wherein the openings have smaller cross-sections than the cooling channel.

7. The pluggable module of claim 1, wherein the openings are sized to block EMI while allowing airflow through the shield plate.

8. The pluggable module of claim 1, wherein the EMI shield further comprises a mounting plate extending between the channel walls, the mounting plate being spaced apart and parallel to the top of the pluggable body, the shield plate extending from the mounting plate to the top.

9. The pluggable module of claim 8, wherein the EMI shield includes a stamped and formed body defining a mounting plate and the shield plate.

10. The pluggable module of claim 8, wherein the mounting plate includes a gasket interface configured to be electrically connected to an EMI gasket of the receptacle assembly.

11. The pluggable module of claim 8, wherein the pluggable body includes a support wall extending from the top, the support wall supporting the mounting plate between the channel walls.

12. The pluggable module of claim 1, wherein the pluggable body includes a plurality of fins extending from the top of the pluggable body, the shield plate spanning between the fins.

13. The pluggable module of claim 12, wherein the fins are plates extending parallel to the channel walls defining airflow channels between the fins, the fins having ends, the shield plate capping the ends of the fins.

14. The pluggable module of claim 1, wherein the EMI shield is electrically connected to the pluggable body.

15. The pluggable module of claim 1, wherein the shield plate includes the openings in a plurality of rows and a plurality of columns.

16. The pluggable module of claim 1, wherein the openings account for at least 50% of the surface area of the shield plate.

17. A pluggable module comprising:
a pluggable body extending between a front end and a mating end, the mating end being receivable in a module cavity of a receptacle assembly to mate with a communication connector, the pluggable body having a top and channel walls extending above the top defining a cooling channel along the top, the cooling channel allowing airflow between the front end and the mating end;
a communication circuit board held in the pluggable body and exposed at the mating end, wherein the pluggable body is configured to be plugged into the receptacle assembly such that the communication circuit board is communicatively coupled to the communication connector of the receptacle assembly; and
an EMI shield coupled to the pluggable body above the top, the EMI shield having a mounting plate spanning between the channel walls, the EMI shield having a shield plate extending from the mounting plate into the cooling channel, the shield plate spanning the cooling channel, the shield plate having openings allowing airflow therethrough to flow through the cooling channel, the EMI shield being metal and providing electrical shielding across the cooling channel, the mounting plate having a gasket interface configured to be electrically connected to an EMI gasket of the receptacle assembly.

18. The pluggable module of claim 17, wherein the mounting plate is spaced apart and parallel to the top of the pluggable body, the shield plate extending from the mounting plate to the top of the pluggable body.

19. The pluggable module of claim 17, wherein the openings of the shield plate are separated by metal strips defining beams.

20. A communication system comprising:
a receptacle assembly having a cage member having a plurality of walls defining a module cavity extending between a front end and a back end, the cage member surrounding a communication connector at the back end, at least one of the walls defining a top of the cage member, the cage member configured to be mounted to a circuit board at a bottom of the cage member, the walls being conductive to provide EMI shielding for the module cavity; and
a pluggable module received in the module cavity and coupled to the communication connector, the pluggable module comprising:
a pluggable body extending between a front end and a mating end, the mating end being receivable in the module cavity through the front end, the pluggable body having a top and channel walls extending above the top defining a cooling channel along the top, the cooling channel allowing airflow interior of the cage member between the front end and the mating end of the pluggable body;
a communication circuit board held in the pluggable body and exposed at the mating end, wherein the pluggable body is configured to be plugged into the receptacle assembly such that the communication circuit board is communicatively coupled to the communication connector of the receptacle assembly; and
an EMI shield coupled to the pluggable body above the top, the EMI shield having a shield plate spanning the cooling channel, the shield plate being metal and providing electrical shielding across the cooling channel, the shield plate having openings allowing airflow therethrough to flow through the cooling channel.

* * * * *